US009076753B2

(12) United States Patent
Iyengar et al.

(10) Patent No.: US 9,076,753 B2
(45) Date of Patent: Jul. 7, 2015

(54) APPARATUS FOR THE COMPACT COOLING OF MODULES

(75) Inventors: Madhusudan K. Iyengar, Woodstock, NY (US); Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 13/475,348

(22) Filed: May 18, 2012

(65) Prior Publication Data
US 2013/0306292 A1 Nov. 21, 2013

(51) Int. Cl.
| | |
|---|---|
| F28F 7/00 | (2006.01) |
| H05K 7/20 | (2006.01) |
| H01L 23/10 | (2006.01) |
| H01L 23/34 | (2006.01) |
| H01L 23/367 | (2006.01) |
| H01L 23/40 | (2006.01) |
| H01L 23/467 | (2006.01) |

(52) U.S. Cl.
CPC ........ *H01L 23/3672* (2013.01); *H01L 23/4093* (2013.01); *H01L 23/467* (2013.01); *H05K 7/20154* (2013.01); *H05K 7/20509* (2013.01); *H01L 2924/0002* (2013.01)

(58) Field of Classification Search
CPC .............................. F28F 7/00; H01L 23/4093
USPC .................. 257/707; 361/704, 720, 718, 719; 165/80.2, 80.4, 185
See application file for complete search history.

(56) References Cited

U.S. PATENT DOCUMENTS

| | | | | |
|---|---|---|---|---|
| 5,396,404 | A * | 3/1995 | Murphy et al. | 361/719 |
| 6,535,387 | B2 * | 3/2003 | Summers et al. | 361/704 |
| 7,626,823 | B2 | 12/2009 | Yang et al. | |
| 8,059,406 | B1 * | 11/2011 | Meyer et al. | 361/701 |
| 2007/0041160 | A1 * | 2/2007 | Kehret et al. | 361/704 |
| 2007/0206360 | A1 * | 9/2007 | Chu | 361/715 |
| 2007/0211426 | A1 * | 9/2007 | Clayton et al. | 361/689 |
| 2007/0263359 | A1 | 11/2007 | Lai et al. | |
| 2008/0101036 | A1 * | 5/2008 | Chen | 361/720 |
| 2009/0109613 | A1 | 4/2009 | Legen et al. | |
| 2009/0129026 | A1 | 5/2009 | Baek et al. | |

FOREIGN PATENT DOCUMENTS

| | | |
|---|---|---|
| CN | 101188217 | 5/2008 |
| DE | 19928075 | 1/2000 |

OTHER PUBLICATIONS

Heejin Lee at al., "Thermal Characteristics of Chip Stack and Package Stack Memory Devices in the Component and Module Lever", 2007.

* cited by examiner

*Primary Examiner* — M. Alexandra Elve
*Assistant Examiner* — Paul Alvare
(74) *Attorney, Agent, or Firm* — Ido Tuchman; Anne V Dougherty (57) ABSTRACT

An apparatus for the compact cooling of modules. The apparatus includes a clip, a first cover plate coupled to a first side of the clip, a second cover plate coupled to a second side of the clip opposite to the first side of the clip, a first frame thermally coupled to the first cover plate, and a second frame thermally coupled to the second cover plate. Each of the first frame and the second frame may include a plurality of channels for passing coolant through the first frame and the second frame, respectively. Additionally, the apparatus may further include a filler for directing coolant through the plurality of channels, and for blocking coolant from flowing along the first side of the clip and the second side of the clip.

18 Claims, 7 Drawing Sheets

APPARATUS FOR THE COMPACT COOLING OF MODULES

GOVERNMENT RIGHTS

This invention was made with Government support under Contract No.: DE-EE0002894 (Department of Energy). The Government has certain rights in this invention.

BACKGROUND

The present invention relates to heat sinks, and more particularly to an apparatus for the compact cooling of memory modules and the like.

In computer systems, memory modules, also known as Dual Inline Memory Modules (DIMMs), typically generate a significant amount of heat during operation. To avoid the risk of DIMM failure due to over-heating, heat has to be dissipated. In general, each DIMM comprises a number of silicon based chips that are responsible for the heat generated in DIMMs. Due to advancements in DIMM technology, the density of and the heat generated by these silicon chips is expected to increase, which could potentially render current cooling solutions inadequate. Hence, to meet anticipated cooling requirements, DIMMs need a better heat dissipation method. Current heat spreaders may be inadequate for the increasing cooling needs of DIMMs.

BRIEF SUMMARY

Accordingly, one example of the present invention is an apparatus for the compact cooling of modules. The apparatus can include a clip, a first cover plate coupled to a first side of the clip, a second cover plate coupled to a second side of the clip opposite to the first side of the clip, a first frame thermally coupled to the first cover plate, and a second frame thermally coupled to the second cover plate. The first frame and the second frame may include channels for passing coolant through the first frame and the second frame, respectively. Additionally, the apparatus may further include a filler for directing coolant through the channels, and for blocking coolant from flowing along the first side of the clip and the second side of the clip.

Another example of the present invention is a heat sink for the compact cooling of modules. The heat sink may include clip, a first cover plate coupled to a first side of the clip, a second cover plate coupled to a second side of the clip opposite to the first side of the clip, a first frame thermally coupled to the first cover plate, and a second frame thermally coupled to the second cover plate. The first frame and the second frame can include channels for passing coolant through the first frame and the second frame, respectively. Additionally, the heat sink can further include a filler for directing coolant through the channels, and for blocking coolant from flowing along the first side of the clip and the second side of the clip.

Yet another embodiment of the invention is an apparatus for the compact cooling of modules. The apparatus includes a U-shaped clip with a top, a first leg, and a second leg. A first cover plate is coupled to the first leg of the clip. The first cover plate is C-shaped and includes a vertical portion, a first horizontal portion, and a second horizontal portion. A second cover plate is coupled to the second leg of the clip opposite to the first leg of the clip. The second cover plate is C-shaped and includes a vertical portion, a first horizontal portion, and a second horizontal portion. The first horizontal portion of the first cover plate contacts the first leg of the clip and defines a first wedge between the top of the clip and the first horizontal portion of the first cover plate for biasing the first cover plate toward the second cover plate. The first horizontal portion of the second cover plate contacts the second leg of the clip and defines a second wedge between the top of the clip and the first horizontal portion of the second cover plate for biasing the second cover plate toward the first cover plate. A first frame is thermally coupled to the first cover plate and is a first unitary sheet of folded metal. The first frame includes a plurality of channels for passing coolant through the first frame. A second frame is thermally coupled to the second cover plate and is a second unitary sheet of folded metal. The second frame includes a plurality of channels for passing coolant through the second frame.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-7. When referring to the figures, like structures and elements shown throughout are indicated with like reference numerals.

Figure 1:
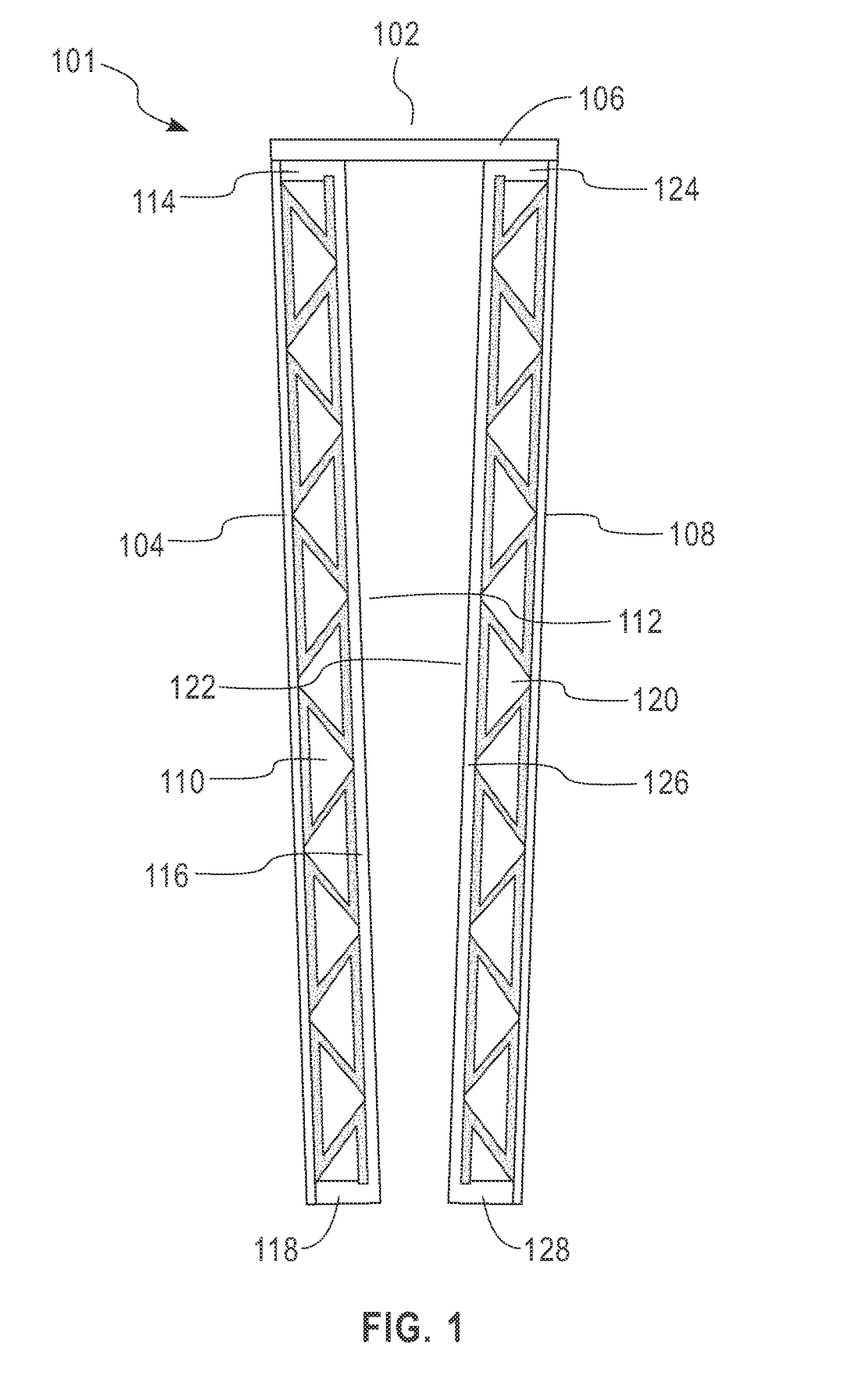
FIG. 1 shows a heat sink for the compact cooling of modules in accordance with one embodiment of the present invention.
Figure 2:
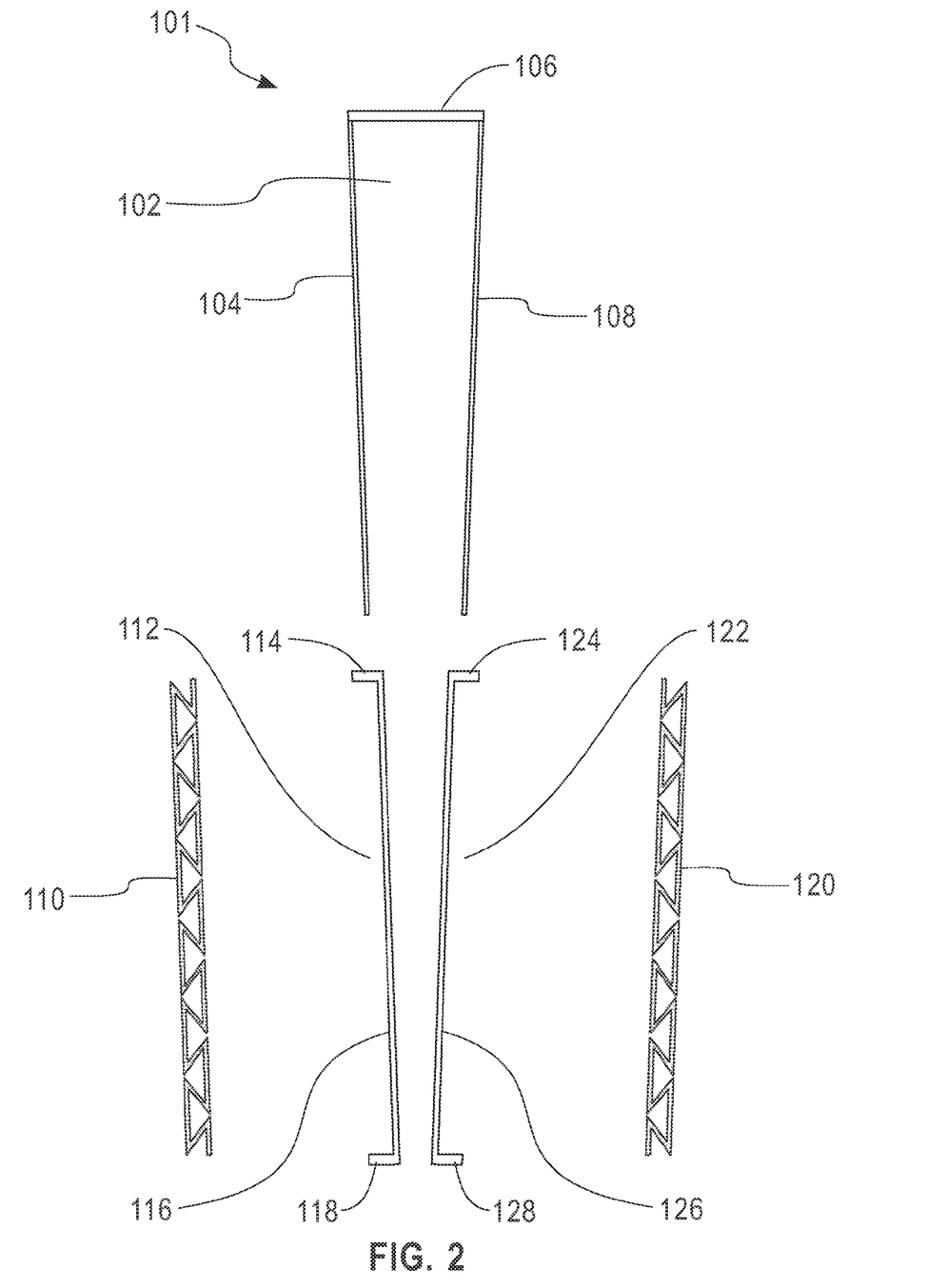
FIG. 2 shows an exploded view of the heat sink for the compact cooling of modules in accordance with one embodiment of the present invention.
Figure 3:
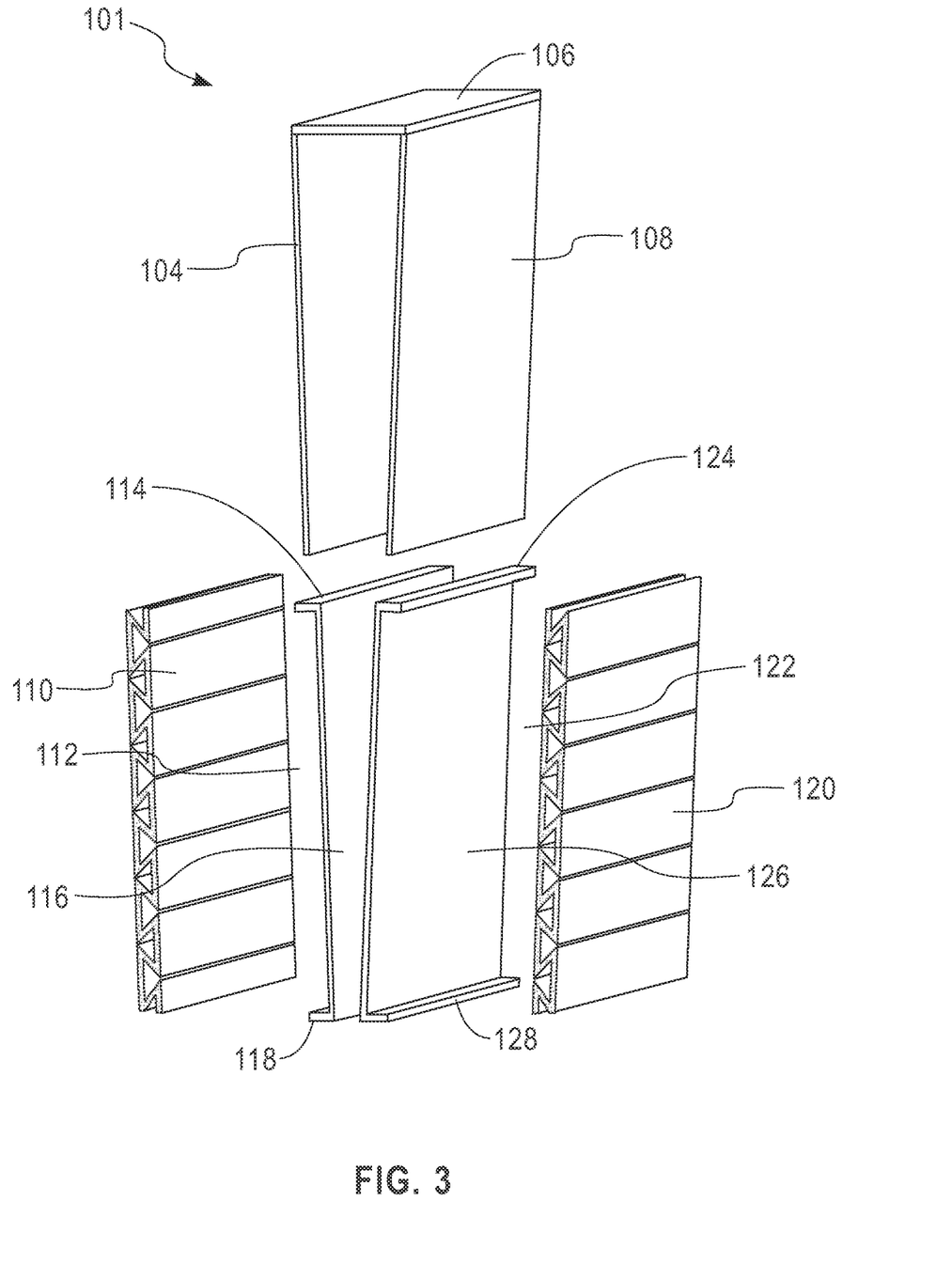
FIG. 3 shows an isometric exploded view of FIG. 2.

FIG. 1 shows a heat sink 101 for the compact cooling of modules in accordance with one embodiment of the present invention. FIG. 2 shows an exploded view of the heat sink 101 of FIG. 1. FIG. 3 shows an isometric exploded view of FIG. 2. The heat sink 101 of FIGS. 1-3 may comprise a clip 102. The clip 102 can be U-shaped, and the U-shape of the clip 102 may provide easy attachment to a memory module (see FIGS. 4 and 5). Additionally, the clip 102 can include a top 106, a first leg 104, and a second leg 108.

The heat sink 101 can also include a first cover plate 112 and a second cover plate 122. The first cover plate 112 may be coupled to a first side of the clip 102, and the second cover plate 122 may be coupled to a second side of the clip 102 opposite to the first side of the clip 102. Additionally, the clip 102 can bias the first cover plate 112 and the second cover plate 122 toward each other. Biasing the first cover plate 112 and the second cover plate 122 toward one another may help ensure thermal contact between the heat sink 101 and the module 430.

The first cover plate 112 and the second cover plate 122 can be C-shaped. Furthermore, the first cover plate 112 may include a vertical portion 116, a first horizontal portion 114, and a second horizontal portion 118. The first horizontal portion of the first cover plate 114 can contact the first leg of the clip 104. Additionally, the second cover plate 122 can include a vertical portion 126, a first horizontal portion 124, and a second horizontal portion 128. The first horizontal portion of the second cover plate 124 may contact the second leg of the clip 108.

The heat sink 101 may further include a first frame 110 and a second frame 120. The first frame 110 can be thermally coupled to the first cover plate 112, and the second frame 120 can be thermally coupled to the second cover plate 122. Additionally, the first frame 110 may include a plurality of channels for passing coolant through the first frame 110, and the second frame 120 may include a plurality of channels for passing coolant through the second frame 120. The coolant can be an air coolant or liquid coolant. Module cooling may improve as the surface area of each of the first frame 110 and the second frame 120 increases.

Furthermore, the first frame 110 and the second frame 120 can each be a unitary sheet of folded metal. Moreover, the first plurality of channels and the second plurality of channels may be triangular channels. With respect to FIG. 1, the coolant may flow through the plurality of channels in a direction that is normal (i.e., into or out of) to the plane of the drawing.

Figure 4:
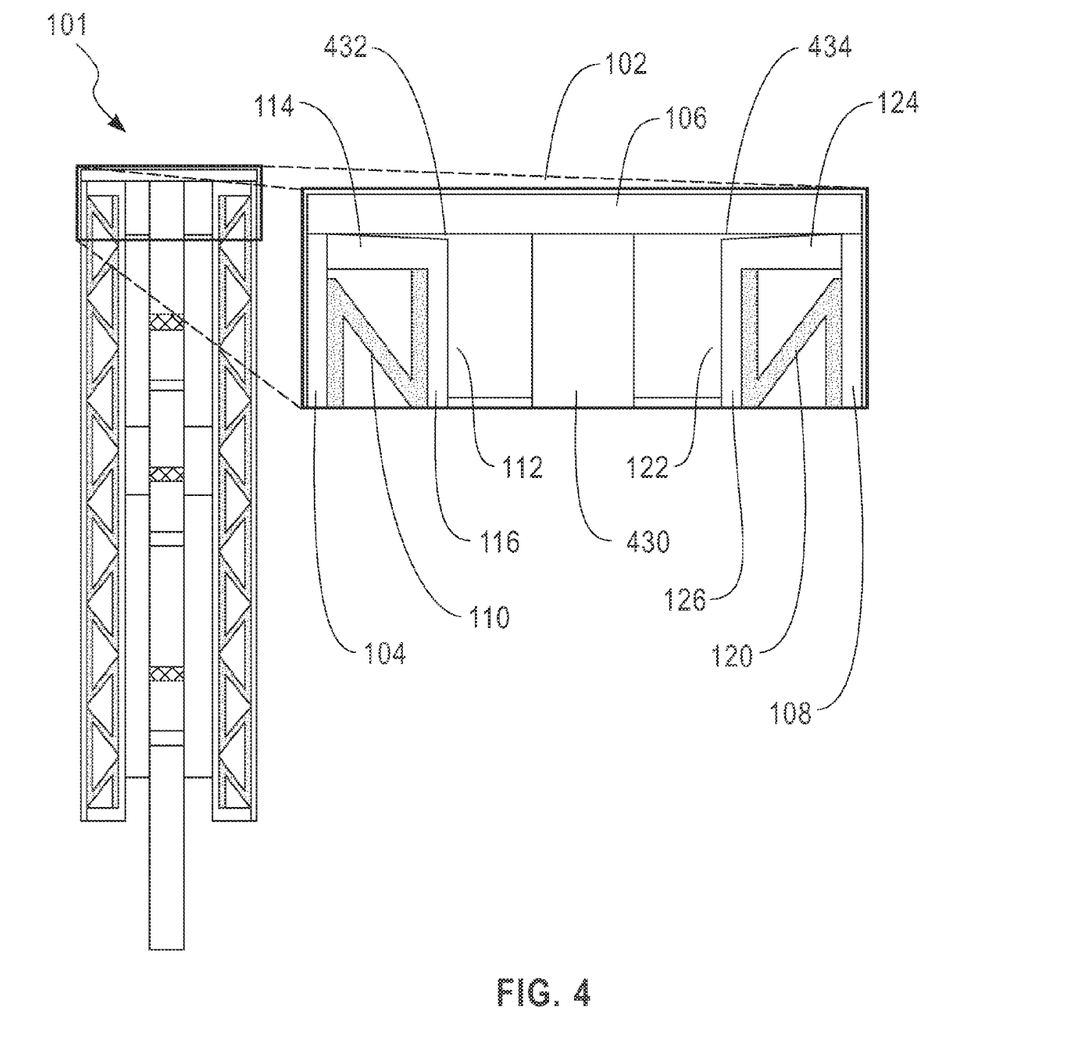
FIG. 4 shows an apparatus for the compact cooling of modules in accordance with another embodiment of the present invention.
Figure 5:
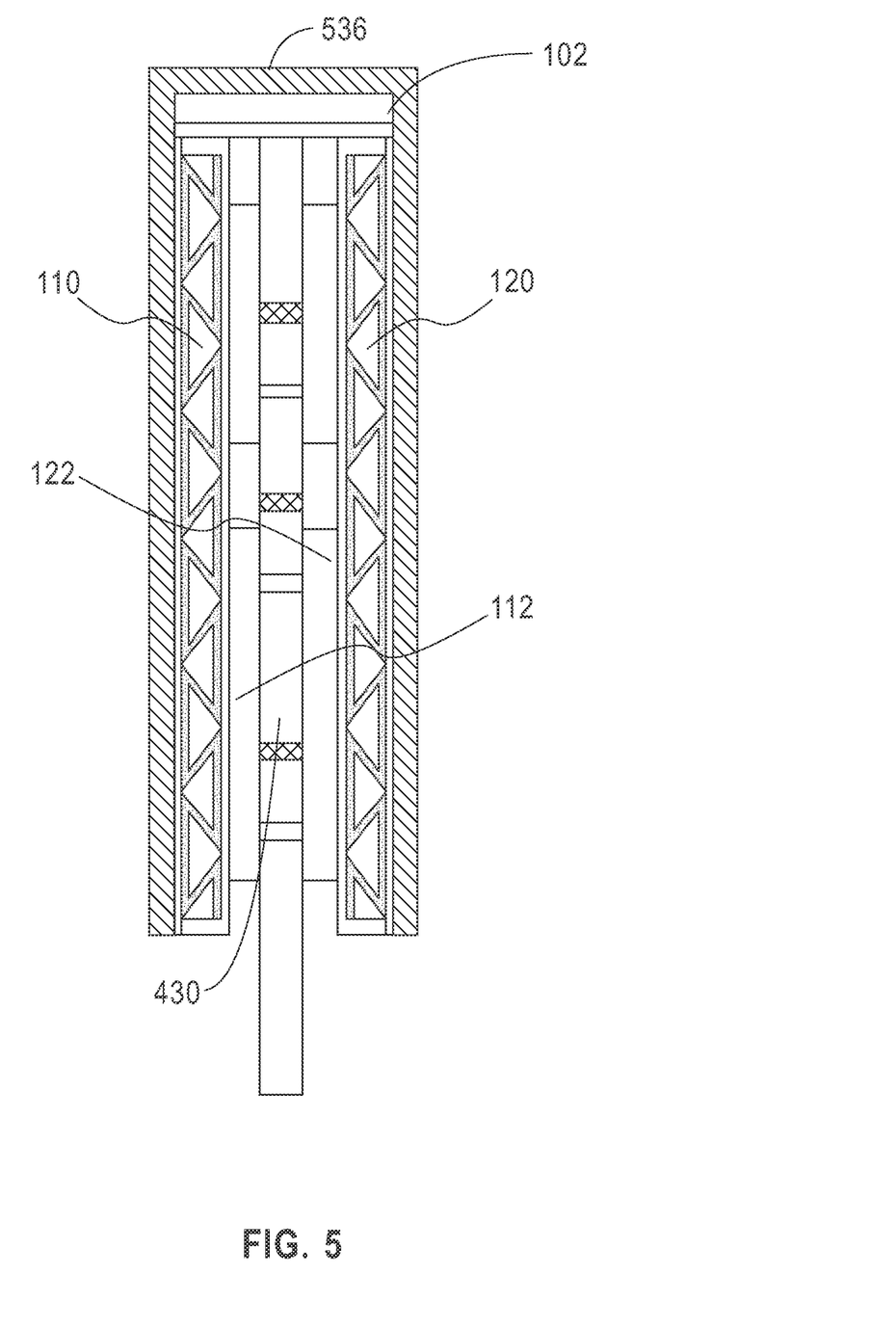
FIG. 5 shows yet another embodiment of the apparatus for the compact cooling of modules contemplated by the present invention.

FIG. 4 shows the heat sink 101 of FIG. 1 engaging a module 430. FIG. 5 shows a filler 536 engaging the heat sink 101 of FIG. 1, which in turn is engaging the module 430 of FIG. 4. The first horizontal portion of the first cover plate 114 can also define a first wedge 432 between the top of the clip 106 and the first horizontal portion of the first cover plate 114. The first wedge 432 may bias the first cover plate 112 toward the second cover plate 122. The first horizontal portion of the second cover plate 124 may also define a second wedge 434 between the top of the clip 106 and the first horizontal portion of the second cover plate 124. The second wedge 434 can bias the second cover plate 122 toward the first cover plate 112.

To properly attach the heat sink 101 to the module 430, the distance between the second horizontal portion of the first cover plate 118 and the second horizontal portion of the second cover plate 128 may be less than the maximum width of the module 430. However, the distance between the first horizontal portion of the first cover plate 114 and the first horizontal portion of the second cover plate 124 can be equal or slightly more than the maximum width of the module 430. In other words, the bend angle of the clip 102 is more than 90° at the junction between the top of the clip 106 and the first leg of the clip 104, and at the junction between the top of the clip 106 and the second leg of the clip 108. Therefore, the first leg of the clip 112 and the second leg of the clip 122 would have to be opened sufficiently to place the heat sink 101 for the compact cooling of modules, on the module 430.

Any appropriate thermal interface material such as thermal grease or thermal oil can be placed between the module 430 and the first cover plate 112, and the module 430 and the second cover plate 122, to ensure proper thermal contact. After the heat sink is placed on the module 430, the bend angle of the clip 102 could be very close to 90° at the junction between the top of the clip 106 and the first leg of the clip 104, and at the junction between the top of the clip 106 and the second leg of the clip 108.

The first wedge 432 and the second wedge 434 may be visible. The first wedge 432 and the second wedge 434 can be created by chamfering the first horizontal portion of the first cover plate 114 and the first horizontal portion of the second cover plate 124, before attaching the latter to the first leg of the clip 104 and the former to the second leg of the clip 108.

The heat sink 101 may also include a filler 536. The filler 536 can engage the first side of the clip 102 and the second side of the clip 102. Additionally, the filler 536 may be configured to block coolant from flowing along the first side of the clip 102 and the second side of the clip 102. The filler 536 may also be configured to direct coolant through the plurality of channels.

Figure 6:
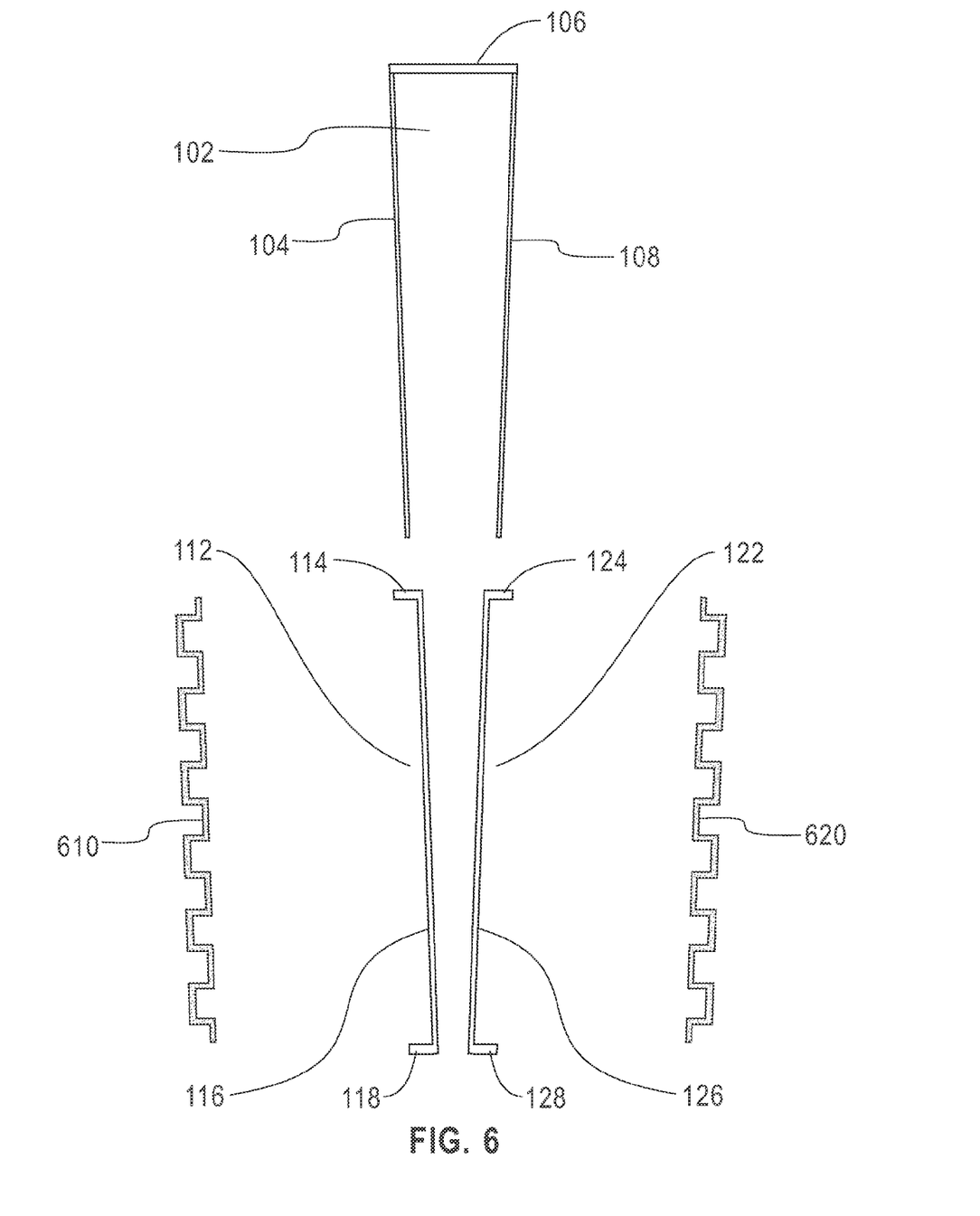
FIG. 6 shows an exploded view of the apparatus for the compact cooling of modules according to one embodiment contemplated by the present invention.
Figure 7:
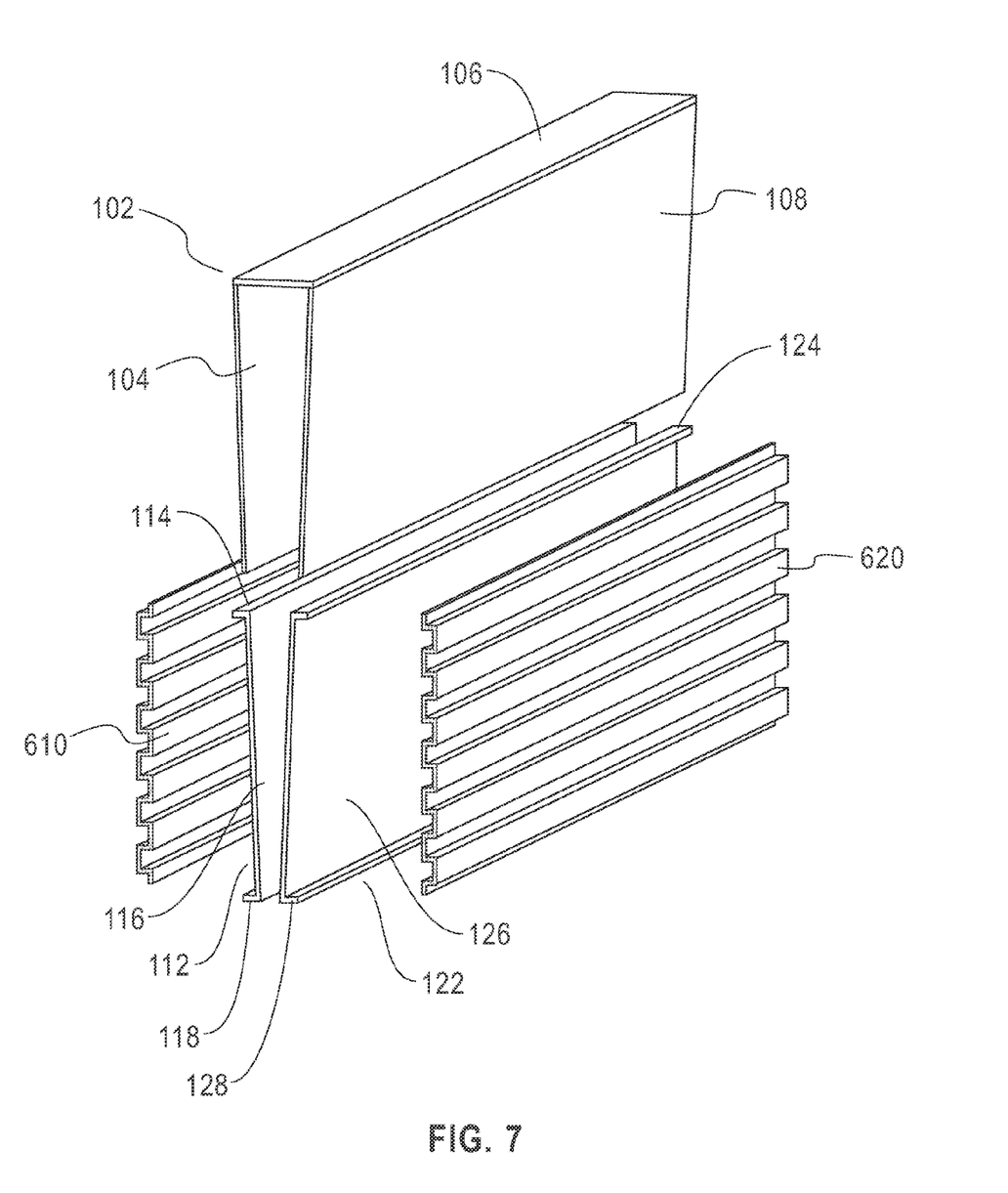
FIG. 7 shows an isometric exploded view of FIG. 6.

FIG. 6 shows an exploded view of an apparatus for the compact cooling of modules in yet another embodiment of the present invention. FIG. 7 shows an isometric view of FIG. 6. The apparatus of FIG. 6 and FIG. 7 may comprise a clip 102. The clip 102 can be U-shaped, and the U-shape of the clip 102 may provide easy attachment to the module 430. Additionally, the clip 102 may include a top 106, a first leg 104, and a second leg 108.

The apparatus can include a first cover plate 112 and a second cover plate 122. The first cover plate 112 may be coupled to a first side of the clip 102, and the second cover plate 122 may be coupled to a second side of the clip 102 opposite to the first side of the clip 102.

The clip 102 can bias the first cover plate 112 and the second cover plate 122 toward one another. Biasing the first cover plate 112 and the second cover plate 122 toward each other may help ensure thermal contact between the apparatus and the memory module. The first cover plate 112 and the second cover plate 122 can be C-shaped.

Furthermore, the first cover plate 112 may include a vertical portion 116, a first horizontal portion 114, and a second horizontal portion 118. The first horizontal portion of the first cover plate 114 can contact the first leg of the clip 104. As discussed above, the first horizontal portion of the first cover plate 114 can also define a first wedge between the top of the clip 106 and the first horizontal portion of the first cover plate 114. The first wedge may bias the first cover plate 112 toward the second cover plate 122.

Additionally, the second cover plate 122 can include a vertical portion 126, a first horizontal portion 124, and a second horizontal portion 128. The first horizontal portion of the second cover plate 124 may contact the second leg of the clip 108. The first horizontal portion of the second cover plate 124 may also define a second wedge between the top of the clip 106 and the first horizontal portion of the second cover plate 124. The second wedge can bias the second cover plate 122 toward the first cover plate 112.

The apparatus may further include a first frame 610 and a second frame 620. The first frame 110 may be thermally coupled to the first cover plate 112, and the second frame 620 may be thermally coupled to the second cover plate 122. Additionally, the first frame 610 can include a plurality of channels for passing coolant through the first frame 610, and the second frame 620 can include a plurality of channels for passing coolant through the second frame 620. The coolant may be either an air coolant or liquid coolant.

Memory module cooling can improve as the surface area of the first frame 610 and the second frame 620 increases. Furthermore, the first frame 610 and the second frame 620 may each be a unitary sheet of folded metal. Moreover, the first plurality of channels and the second plurality of channels can be rectangular channels.

One embodiment of the heat sink or apparatus for the compact cooling of modules contemplated by the present invention can be fabricated in a few steps. First, the triangular/rectangular channels may be fabricated by folding a sheet of metal to form a folded-fin structure having the fin height as the triangular/rectangular channel height and the fin width as the triangular/rectangular channel base width. In the case of triangular channels, the folded-fin structure can then be compressed horizontally from the sides to form an alternating triangular channels structure. The aforementioned fabrication steps may be performed on a first sheet of metal to form a first frame 110, and then repeated on a second sheet of metal to form a second frame 120. Next, the first frame 110 can be placed and attached to the first cover plate 112, and the second frame 120 can be placed and attached to the second cover plate 122, using soldering, brazing, direct-bonding, or any other applicable process.

Next, a side of the first frame 110 opposite to a side of the of the first frame 110 that is facing the vertical portion of the first cover plate 116 may be attached to the first leg of the clip 104. A side of the second frame 120 opposite to a side of the second frame 120 that is facing the vertical portion of the first cover plate 116 may be attached to the second leg of the clip 108. The first frame 110 can be attached to the first leg of the clip 104, and the second frame 120 can be attached the second leg of the clip 108, using any applicable process.

The thickness and the bend angle of the first leg of the clip 104 and the second leg of the clip 108 can be selected based on the spring force required for proper thermal contact between the heat sink and the memory module.

In general, the heat sink or apparatus for the compact cooling of modules may comprise of the clip 102, the first cover plate 112, the second cover plate 122, the first frame 110 and the second frame 120. The first frame 110 and the second frame 120 may include one or more layers of triangular/rectangular channels or a mix of triangular and rectangular channels in each. In the case of more than one layer, the first frame 110 and the second frame 120 can each further include a separating plate. Although the number of layers may depend on the spacing between modules, and the heat that needs to be dissipated from the modules, one layer may be appropriate for conventional memory module boards.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for the compact cooling of modules, the apparatus comprising:
   a clip including a top member, a first leg and a second leg, the first leg and the second leg extending from opposite horizontal ends of the top member;
   a first cover plate coupled to the first leg of the clip, the first cover plate including a first horizontal portion projecting from a first intersection of the top member and the first leg toward the second leg, and a first vertical portion extending from the first horizontal portion along the first leg, wherein
   the first horizontal portion is chamfered to define a first wedge between the top member and the first horizontal portion for biasing the first cover plate towards a second cover plate,
   the chamfer of the first horizontal portion is defined as having a first cross sectional area adjacent the first leg of the clip and a second cross sectional area adjacent the first vertical portion, wherein said first cross sectional area is greater than said second cross sectional area;
   a first frame thermally coupled to the first cover plate, the first frame including a plurality of channels for passing coolant through the first frame;
   the second cover plate coupled to the second leg of the clip, the second cover plate including a second horizontal portion projecting from a second intersection of the top member and the second leg toward the first leg and a second vertical portion extending from the second horizontal portion along the second leg, wherein
   the second horizontal portion is chamfered to define a second wedge between the top member and the second horizontal portion for biasing the second cover plate towards the first cover plate,
   the chamfer of the second horizontal portion is defined as having a first cross sectional area adjacent the second leg of the clip and a second cross sectional area adjacent the second vertical portion, wherein said first cross sectional area is greater than said second cross sectional area; and
   a second frame thermally coupled to the second cover plate,
the second frame including a plurality of channels for passing coolant through the second frame.

2. The apparatus of claim 1, wherein the clip is U-shaped.

3. The apparatus of claim 1, wherein the first cover plate is C-shaped and the second cover plate is C-shaped.

4. The apparatus of claim 1, wherein the first frame is a unitary sheet of folded metal and the second frame is a unitary sheet of folded metal.

5. The apparatus of claim 1, wherein the plurality of channels are triangular channels.

6. The apparatus of claim 1, wherein the plurality of channels are rectangular channels.

7. The apparatus of claim 1, further comprising a filler engaging the first leg of the clip and the second leg of the clip, the filler configured to block coolant flow along the first leg of the clip and the second leg of the clip, and to direct coolant through the plurality of channels.

8. A heat sink comprising:
   a clip including a top member, a first leg and a second leg, the first leg and the second leg extending from opposite horizontal ends of the top member;
   a first cover plate coupled to the first leg of the clip, the first cover plate including a first horizontal portion projecting from a first intersection of the top member and the first leg toward the second leg and a first vertical portion extending from the first horizontal portion along the first leg, wherein
   the first horizontal portion is chamfered to define a first wedge between the to member and the first horizontal portion for biasing the first cover plate towards a second cover plate,
   the chamfer of the first horizontal portion is defined as having a first cross sectional area adjacent the first leg of the clip and a second cross sectional area adjacent the first vertical portion, wherein said first cross sectional area is greater than said second cross sectional area;
   a first frame thermally coupled to the first cover plate, the first frame including a plurality of channels for passing coolant through the first frame;
   the second cover plate coupled to the second leg of the clip, the second cover plate including a second horizontal portion projecting from a second intersection of the top member and the second leg toward the first leg and a second vertical portion extending from the second horizontal portion along the second leg, wherein the second horizontal portion is chamfered to define a second wedge between the top member and the second horizontal portion for biasing the second cover plate towards the first cover plate, the chamfer of the second horizontal portion is defined as having a first cross sectional area adjacent the second leg of the clip and a second cross sectional area adjacent the second vertical portion, wherein said first cross sectional area is greater than said second cross sectional area; and a second frame thermally coupled to the second cover plate, the second frame including a plurality of channels for passing coolant through the second frame.

9. The heat sink of claim 8, wherein the clip is U-shaped.

10. The heat sink of claim 8, wherein the first cover plate is C-shaped and the second cover plate is C-shaped.

11. The heat sink of claim 8, wherein the first frame is a first unitary sheet of folded metal, and the second frame is a second unitary sheet of folded metal.

12. The heat sink of claim 8, wherein the plurality of channels are triangular channels.

13. The heat sink of claim 8, wherein the plurality of channels are rectangular channels.

14. The apparatus of claim 8, further comprising a filler engaging the first leg of the clip and the second leg of the clip, the filler configured to block coolant flow along the first leg of the clip and the second leg of the clip, and to direct coolant through the plurality of channels.

15. An apparatus for the compact cooling of modules, the apparatus comprising:

a U-shaped clip including a top member, a first leg and a second leg;

a first cover plate coupled to the first leg of the clip, the first cover plate being C-shaped and including a vertical portion along the first leg, a first horizontal portion, and a second horizontal portion, the first horizontal portion of the first cover plate projecting from a first intersection of the top member and the first leg toward the second leg, the first horizontal portion of the first cover plate is chamfered to define a first wedge between the top member of the clip and the first horizontal portion of the first leg for biasing the first cover plate toward the second cover plate;

the chamfer of the first cover plate is defined as having a first cross sectional area adjacent the first lea of the clip and a second cross sectional area adjacent the first vertical portion, wherein said first cross sectional area is greater than said second cross sectional area;

a second cover plate coupled to the second leg of the clip opposite the first leg of the clip, the second cover plate being C-shaped and including a vertical portion along the second leg, a first horizontal portion, and a second horizontal portion, the first horizontal portion of the second cover plate projecting from a first intersection of the top member and the second leg toward the first leg, the first horizontal portion of the second cover plate is chamfered to define a second wedge between the top member of the clip and the first horizontal portion of the second cover plate for biasing the second cover plate toward the first cover plate;

the chamfer of the second cover plate is defined as having a first cross sectional area adjacent the second leg of the clip and a second cross sectional area adjacent the second vertical portion, wherein said first cross sectional area is greater than said second cross sectional area;

a first frame thermally coupled to the first cover plate, the first frame being a first unitary sheet of folded metal and including a plurality of channels for passing coolant through the first frame;

a second frame thermally coupled to the second cover plate, the second frame being a second unitary sheet of folded metal and including a plurality of channels for passing coolant through the second frame.

16. The apparatus of claim 15, wherein the plurality of channels are triangular channels.

17. The apparatus of claim 15, wherein the plurality of channels are rectangular channels.

18. The apparatus of claim 15, further comprising a filler engaging the first leg of the clip and the second leg of the clip, the filler configured to block coolant flow along the first leg of the clip and the second leg of the clip, and to direct coolant through the first plurality of channels and the second plurality of channels.

* * * * *